United States Patent
Marchiori et al.

(10) Patent No.: US 9,953,839 B2
(45) Date of Patent: Apr. 24, 2018

(54) GATE-STACK STRUCTURE WITH A DIFFUSION BARRIER MATERIAL

(71) Applicant: International Business Machines Corporation, Armonk, NY (US)

(72) Inventors: Chiara Marchiori, Yorktown Heights, NY (US); Federico Zipoli, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/240,031

(22) Filed: Aug. 18, 2016

(65) Prior Publication Data
US 2018/0053656 A1 Feb. 22, 2018

(51) Int. Cl.
| | | |
|---|---|---|
| *H01L 29/78* | (2006.01) | |
| *H01L 21/20* | (2006.01) | |
| *H01L 21/336* | (2006.01) | |
| *H01L 21/283* | (2006.01) | |
| *H01L 21/28* | (2006.01) | |
| *H01L 29/66* | (2006.01) | |

(Continued)

(52) U.S. Cl.
CPC .. *H01L 21/28264* (2013.01); *H01L 21/02115* (2013.01); *H01L 21/02126* (2013.01); *H01L 21/02167* (2013.01); *H01L 21/02181* (2013.01); *H01L 21/02447* (2013.01); *H01L 21/02529* (2013.01); *H01L 21/02538* (2013.01); *H01L 29/20* (2013.01); *H01L 29/517* (2013.01); *H01L 29/66522* (2013.01)

(58) Field of Classification Search
CPC ..... H01L 29/513; H01L 29/78; H01L 29/517; H01L 29/66522; H01L 21/28264; H01L 21/3148; H01L 21/31645; H01L 21/28158; H01L 21/02167; H01L 21/7602; H01L 29/51–29/518; H01L 29/28158; H01L 2924/10272; H01L 2924/04642; H01L 21/02181; H01L 21/02115; H01L 21/02126; H01L 21/02447; H01L 21/02529
See application file for complete search history.

(56) References Cited

U.S. PATENT DOCUMENTS

| | | | |
|---|---|---|---|
| 4,929,985 A | * | 5/1990 | Takasaki ............... H01L 29/267 257/191 |
| 8,258,589 B2 | | 9/2012 | Sunamura |

(Continued)

OTHER PUBLICATIONS

Maciej Wolborski "Characterization of Dielectric Layers for Passivation of 4H—SiC Devices" Laboratory of Solid State Electronics, Department of Microelectronics and Applied Physics—Royal Institute of Technology, Stockholm 2006.

(Continued)

*Primary Examiner* — Marvin Payen
*Assistant Examiner* — Jeremy Joy
(74) *Attorney, Agent, or Firm* — Harrington & Smith

(57) ABSTRACT

This invention relates to an apparatus, system, and method for creating a high-k gate stack structure that includes a passivation layer. The passivation layer can be constructed from a deposition of silicon carbide. The silicon carbide provides robustness against oxidation, which can reduce the capacity of the stack. The silicon carbide is thermodynamically stable during the deposition process and results in a clean interface.

20 Claims, 13 Drawing Sheets

(51) Int. Cl.
  *H01L 29/20* (2006.01)
  *H01L 29/51* (2006.01)
  *H01L 21/02* (2006.01)

(56) References Cited

U.S. PATENT DOCUMENTS

| | | | |
|---|---|---|---|
| 8,853,792 B2 | 7/2014 | Chowdhury et al. | |
| 8,809,860 B2 | 8/2014 | Shiu et al. | |
| 9,093,480 B2 | 7/2015 | Makala et al. | |
| 2003/0001191 A1* | 1/2003 | Forbes | H01L 21/28273 257/306 |
| 2003/0042528 A1* | 3/2003 | Forbes | G11C 7/20 257/315 |
| 2005/0233598 A1* | 10/2005 | Jung | C23C 16/402 438/785 |
| 2006/0024878 A1* | 2/2006 | Forbes | G11C 16/0416 438/211 |
| 2006/0197141 A1* | 9/2006 | Ufert | H01L 21/28282 257/315 |
| 2006/0237771 A1* | 10/2006 | Forbes | H01L 29/513 257/315 |
| 2006/0249815 A1* | 11/2006 | Forbes | H01L 31/1808 257/616 |
| 2006/0292872 A1* | 12/2006 | Haukka | C23C 16/0272 438/680 |
| 2007/0161214 A1* | 7/2007 | Fompeyrine | H01L 21/28158 438/483 |
| 2008/0121932 A1* | 5/2008 | Ranade | H01L 21/28255 257/192 |
| 2010/0123205 A1* | 5/2010 | de Souza | H01L 21/28264 257/410 |
| 2011/0089469 A1* | 4/2011 | Merckling | H01L 21/28264 257/201 |
| 2011/0240114 A1* | 10/2011 | Stewart | H01L 31/02167 136/256 |
| 2013/0043545 A1* | 2/2013 | Lee | H01L 21/28185 257/411 |
| 2013/0247972 A1* | 9/2013 | Mungekar | H01L 31/02167 136/256 |
| 2013/0337624 A1* | 12/2013 | Baiocco | H01L 29/66477 438/294 |
| 2014/0035001 A1* | 2/2014 | Czornomaz | H01L 29/78 257/192 |
| 2014/0353771 A1* | 12/2014 | Wang | H01L 21/02181 257/411 |
| 2015/0123119 A1* | 5/2015 | Sekine | H01L 27/14663 257/43 |
| 2015/0179743 A1 | 6/2015 | Niyogi | |
| 2016/0071855 A1 | 3/2016 | Park et al. | |

OTHER PUBLICATIONS

"Amorphous Silicon Carbide Passivating Layers for Crystalline-Silicon-Based Heterojunction Solar Cells" http://scitation.aip.org/content/aip/journal/jap/118/6/10.1063/1.4928203.

Sanjeev Kumar Gupta, Jitendra Singh and Jamil Akhtar "Materials and Processing for Gate Dielectrics on Silicon Carbide (SiC) Surface" http://dx.doi.org/10.5772/52553.

* cited by examiner

GATE-STACK STRUCTURE WITH A DIFFUSION BARRIER MATERIAL

FIELD OF TECHNOLOGY

The present invention is in the technical field of semiconductor devices and fabrication techniques and, more specifically, relates to the fabrication of semiconductor transistor devices, such as field effect transistors (FETs), using silicon carbide in the gate stack structure fabrication process.

BACKGROUND OF THE INVENTION

For the past several decades, the shrinking of feature sizes in integrated circuits has enabled faster and more efficient devices. Scaling to smaller feature sizes also enables increased densities of functional units on the limited real estate of semiconductor chips. As the geometries of electronic devices continue to shrink and the density of devices continues to increase, the size and aspect ratio of the features are becoming more aggressive, e.g., feature sizes of 15 nm or smaller and aspect ratios of 10 or greater are being considered. The increasingly smaller devices are not without issue, and new device fabrication techniques are necessary to overcome the physical obstacles that become apparent at small sizes.

Currently, the semiconductor industry relies on the ability to reduce or scale the dimensions of the basic components, including the gate dielectric, of its transistor devices to obtain lower power consumption and higher performance. To reduce transistor size, the thickness of the gate dielectric is reduced in proportion to the shrinkage of the gate length. Increased scaling and other requirements in microelectronic devices have created the need to use other dielectric materials as gate dielectrics, in particular dielectrics with higher dielectric constants (k) to replace the conventional use of various combinations of $SiO_2$, $Si_3N_4$, and SiON. Practical higher dielectric constant (k) materials, in some cases, have the properties of high permittivity, thermal stability, high film and surface quality and smoothness, low hysteresis characteristics, low leakage current density, and long term reliability. However, polysilicon gates and high-k dielectric materials have interface issues.

Therefore, there is a need for a process to form dielectric materials, especially high-k dielectric materials, which have reduced defects from oxide formation.

SUMMARY OF INVENTION

This summary is provided with the understanding that it will not be used to limit the scope or meaning of the claims.

According to an embodiment of the invention, an apparatus is provided for a gate stack structure comprising a layer of III-V material; a passivation layer deposited on the layer of III-V material, wherein the passivation layer comprises a layer of amorphous silicon carbide; and a layer of a high-k material deposited on the passivation layer.

According to another embodiment of the invention, a passivating layer for a III-V semiconductor material is provided comprising an at least one monolayer thick silicon carbide layer which bonds with the atomic constituents of said semiconductor material to prevent the formation of an oxide at the interface between said passivating layer and said semiconductor material.

According to another embodiment, a method for constructing a gate stack is provided, the method comprising providing a semiconductor layer, wherein the semiconductor layer comprises a III-V material layer; depositing III-V material onto the semiconductor layer to create a III-V channel layer; depositing silicon carbide onto the semiconductor layer to create an amorphous silicon carbide layer on the semiconductor layer; and depositing a dielectric material having dielectric constant greater than silicon oxide onto the amorphous silicon carbide layer to create a high-k material layer on the amorphous silicon carbide layer.

Numerous other embodiments are described throughout herein. All of these embodiments are intended to be within the scope of the invention herein disclosed. Although various embodiments are described herein, it is to be understood that not necessarily all objects, advantages, features or concepts need to be achieved in accordance with any particular embodiment. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

These and other features, aspects and advantages of the present invention will become understood with reference to the following description, appended claims and accompanying figures.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and the invention may admit to other equally effective embodiments.

Figure 1:
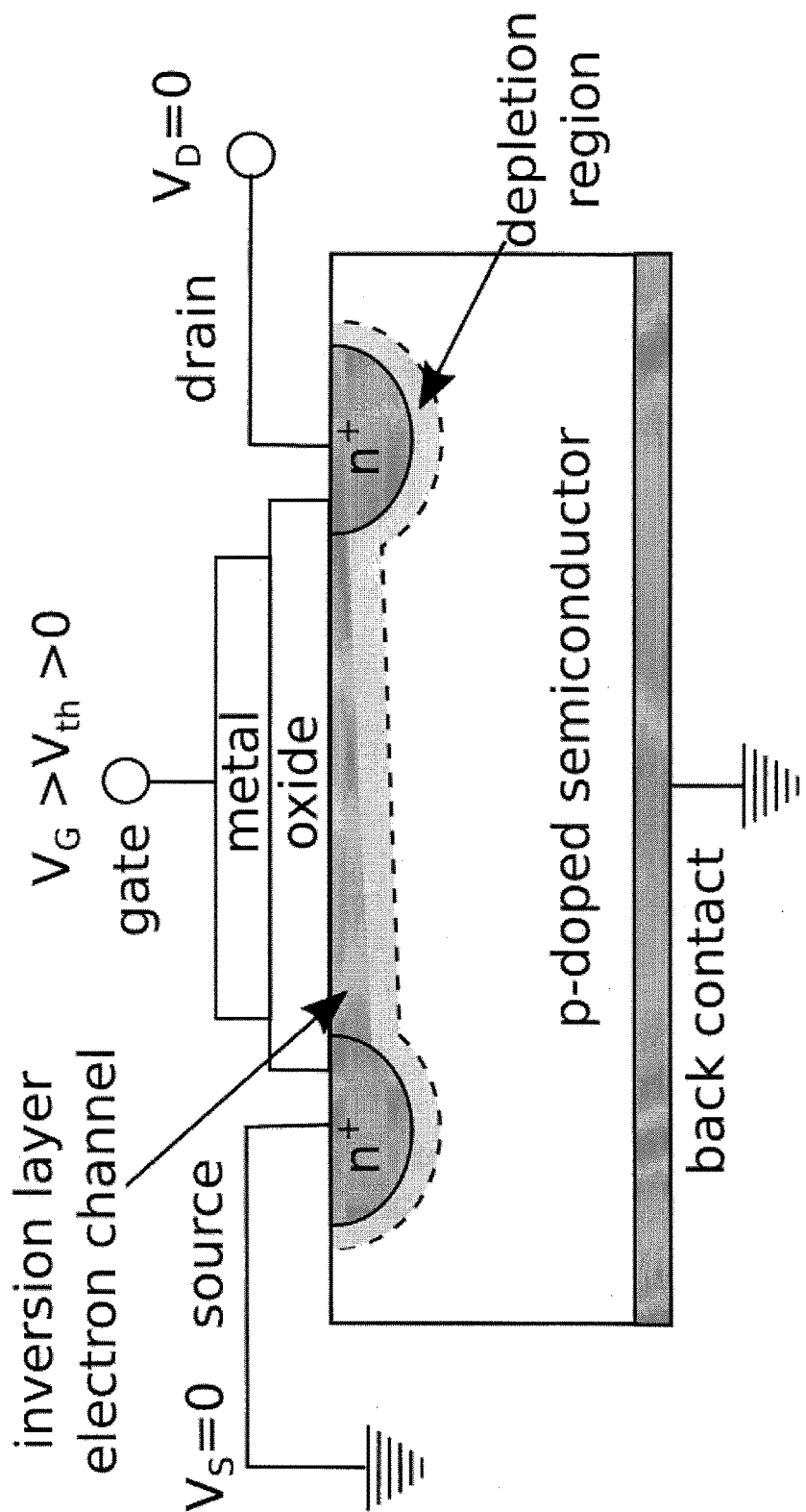
FIG. 1 illustrates a MOSFET structure.

To facilitate understanding, identical reference numerals have been used, wherever possible, to designate identical elements that are common to the figures. It is contemplated that elements and/or process steps of one embodiment may be beneficially incorporated in other embodiments without additional recitation. Other features of the present embodiments will be apparent from the Detailed Description that follows.

DETAILED DESCRIPTION OF THE EMBODIMENTS

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention. Electrical, mechanical, logical and structural changes may be made to the embodiments without departing from the spirit and scope of the present teachings. The following detailed description is therefore not to be taken in a limiting sense, and the scope of the present disclosure is defined by the appended claims and their equivalents.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Embodiments of the present invention generally relate to a method and an apparatus for depositing a high-k dielectric material on a substrate, and more specifically, to methods for depositing and stabilizing dielectric materials while forming a high-k gate stack. Silicon carbide is used to passivate bonding defects in the high-k gate stack. FIG. 1 illustrates a MOSFET structure. In an embodiment, the processes described herein may be used in the fabrication of the gate of such a transistor. Multilayer gate structures can be fabricated according to an embodiment of the invention by combining multiple oxides. For example, between the metal layer and the semiconductor layer, there may be multiple layers of hafnium oxide and aluminum oxide. These layers can be tailored for the particular materials with which they interface.

High-k dielectrics, as used in this disclosure, generally refer to a variety of compositions that are homogenous, heterogeneous, graded and/or multiple layered stacks or laminates. The high-k dielectric may include combinations of hafnium, zirconium, titanium, tantalum, lanthanum, aluminum, silicon, oxygen and/or nitrogen. High-K dielectric materials may include silicon oxynitrides ($SiO_xN_y$), hafnium containing materials, such as hafnium oxides ($HfO_x$ including $HfO_2$), hafnium silicates ($HfSi_xO_y$ including $HfSiO_4$), hafnium, silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), hafnium lanthanum silicon oxides ($HfLa_xSi_yO_z$), hafnium lanthanum silicon oxynitrides ($HfLa_wSi_xO_yN_z$), zirconium containing materials, such as zirconium oxides ($ZrO_x$ including $ZrO_2$), zirconium silicates ($ZrSi_xO_y$ including $ZrSiO_4$), zirconium silicon oxynitrides ($ZrSi_xO_yN_z$), zirconium oxynitrides ($ZrO_xNy$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), other suitable materials, composites thereof, and combinations thereof. Other high-k dielectric materials useful for dielectric layers may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). Laminate films that are useful dielectric materials for high-k dielectric layers include $HfO_2/Al_2O_3$, $HfO_2/SiO_2$, $La_2O_3/Al_2O_3$ and $HfO_2/SiO_2/Al_2O_3$.

The substrates disclosed refer to any substrate or material surface formed upon which film processing is performed. For example, a substrate on which processing can be performed include compound semiconductor with one or more species are taken from group III and one or more species taken from group V (III-V materials), including, but not limited to, boron nitride (BN), boron arsenide (BAs), aluminum nitride (AlN), aluminum phosphide (AlP), aluminum arsenide (AlAs), gallium nitride (GaN), gallium phosphide (GaP), gallium arsenide (GaAs), indium nitride (InN), indium phosphide (InP), indium arsenide (InAs), and indium antimonide (InSb). Alloys of III-V materials, such as indium gallium arsenide (InGaAs), indium gallium phosphide (InGaP), indium gallium nitride (InGaN), and aluminum gallium indium phosphide (AlGaInP), may be used as substrates. Other materials may be used, such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Processes of the embodiments described herein deposit dielectric materials on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

The structures disclosed herein can be produced by film processing, such as atomic layer deposition or other techniques that sequentially introduce two or more reactive compounds to deposit a layer of material on a substrate surface. Amorphous silicon-carbide films can be deposited by plasma enhanced chemical vapor deposition (PECVD) on the III-V channel material at 175 Celsius degrees using silacyclobutane. Other precursors such as silanes and methane can be used. The dielectric properties of the amorphous silicon-carbide films depend both on the combination of precursors and the RF plasma frequency. Typically low plasma frequencies result in higher dielectric constant. The deposition procedure can be modified to allow for a first III-V cleaning step in vacuum, either by heating the sample or by exposing the material to hydrogen plasma. The two, three, or more reactive compounds may alternatively be introduced into a reaction zone of a process chamber. Usually, each reactive compound is separated by a time delay to allow each compound to adhere and/or react on the substrate surface. Optional pretreatment steps, such as polishing, etching, reduction, oxidation, hydroxylation, annealing, and/or baking may be done on the substrate.

Figure 2:
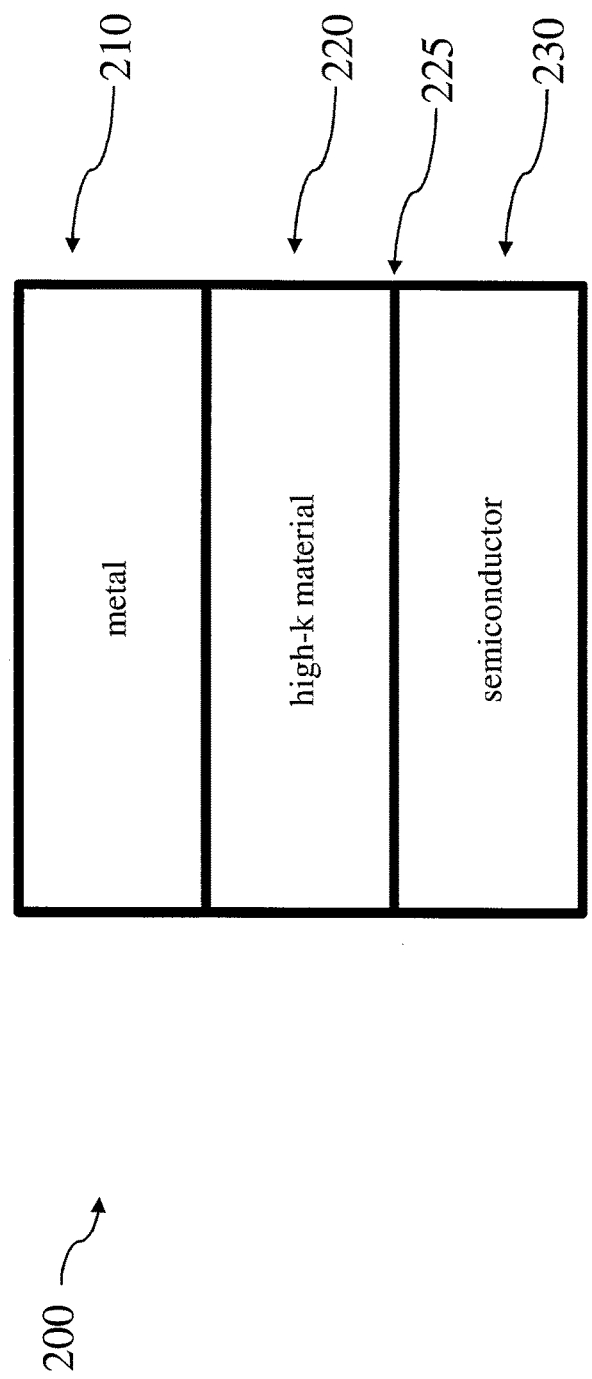
FIG. 2 illustrates a prototypical example of a gate stack with a high-k material gate.

FIG. 2 illustrates a typical gate stack structure 200, according to an embodiment of the present invention. The semiconductor 230 is the base upon which the gate is fabricated. A high-k material 220 is deposited on the semiconductor 230, and a metal 210 is deposited on the high-k material 220. This deposition process results in an interface 225 between the high-k material and the semiconductor 230. When the semiconductor 230 is a III-V material, and the high-k material is $HfO_2$, there is no native oxide for a smooth interface 225. Rather, defects will form at the interface 225. In addition, there will be a low density of states at the interface 225, which will increase the sub-threshold swing defects in the conduction band trap electrons.

Figure 3:
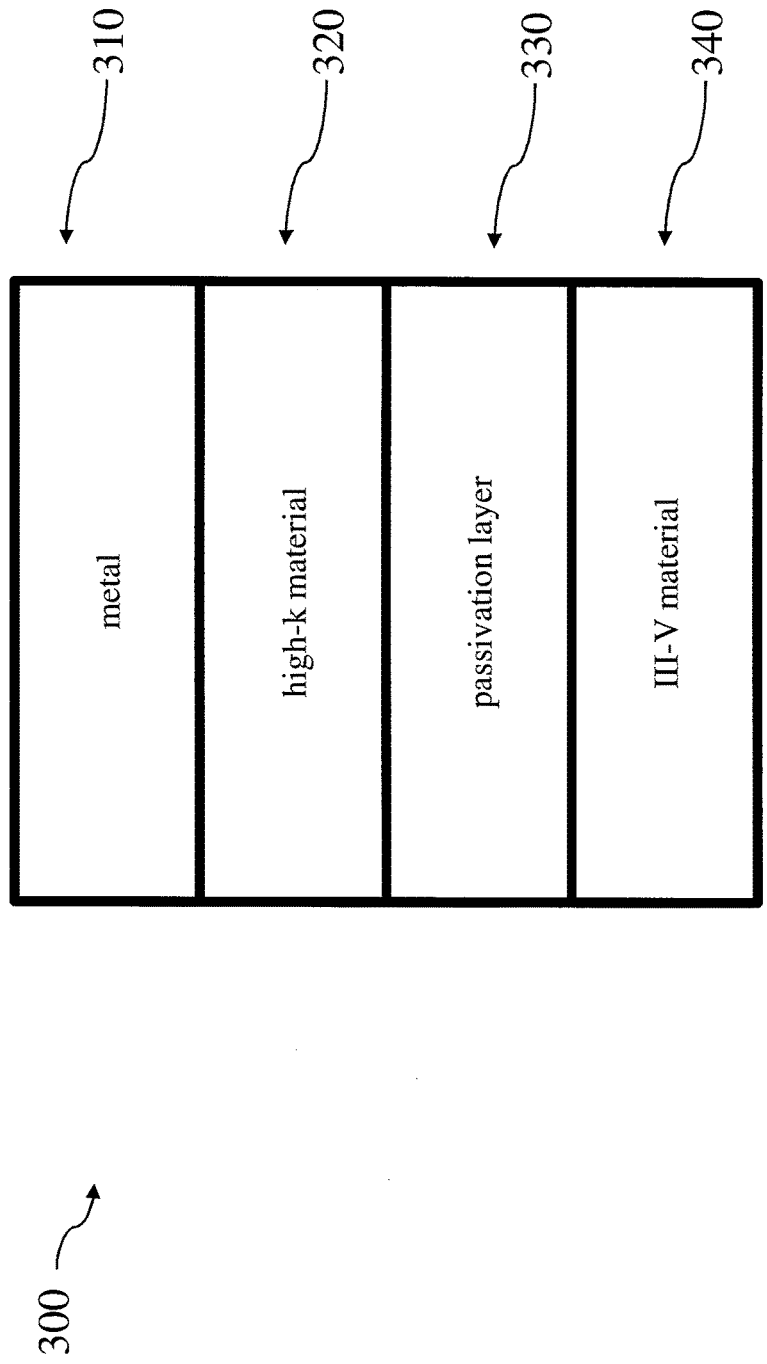
FIG. 3 illustrates a prototypical example of a gate stack with a passivation layer.

An approach to preventing the defects in the interface 225 is to add a passivation layer. FIG. 3 illustrates a gate stack structure 300 with a passivation layer 330 between the III-V material 340 and the high-k material 320. The metal 310 signal line then connects to the high-k material 320. In an embodiment, the passivation layer 330 is amorphous silicon (a-Si). In an alternative embodiment, the passivation layer 330 is hydrogenated amorphous silicon (a-Si:H). The amorphous silicon acts to protect the III-V material 340 from oxidation.

Figure 4:
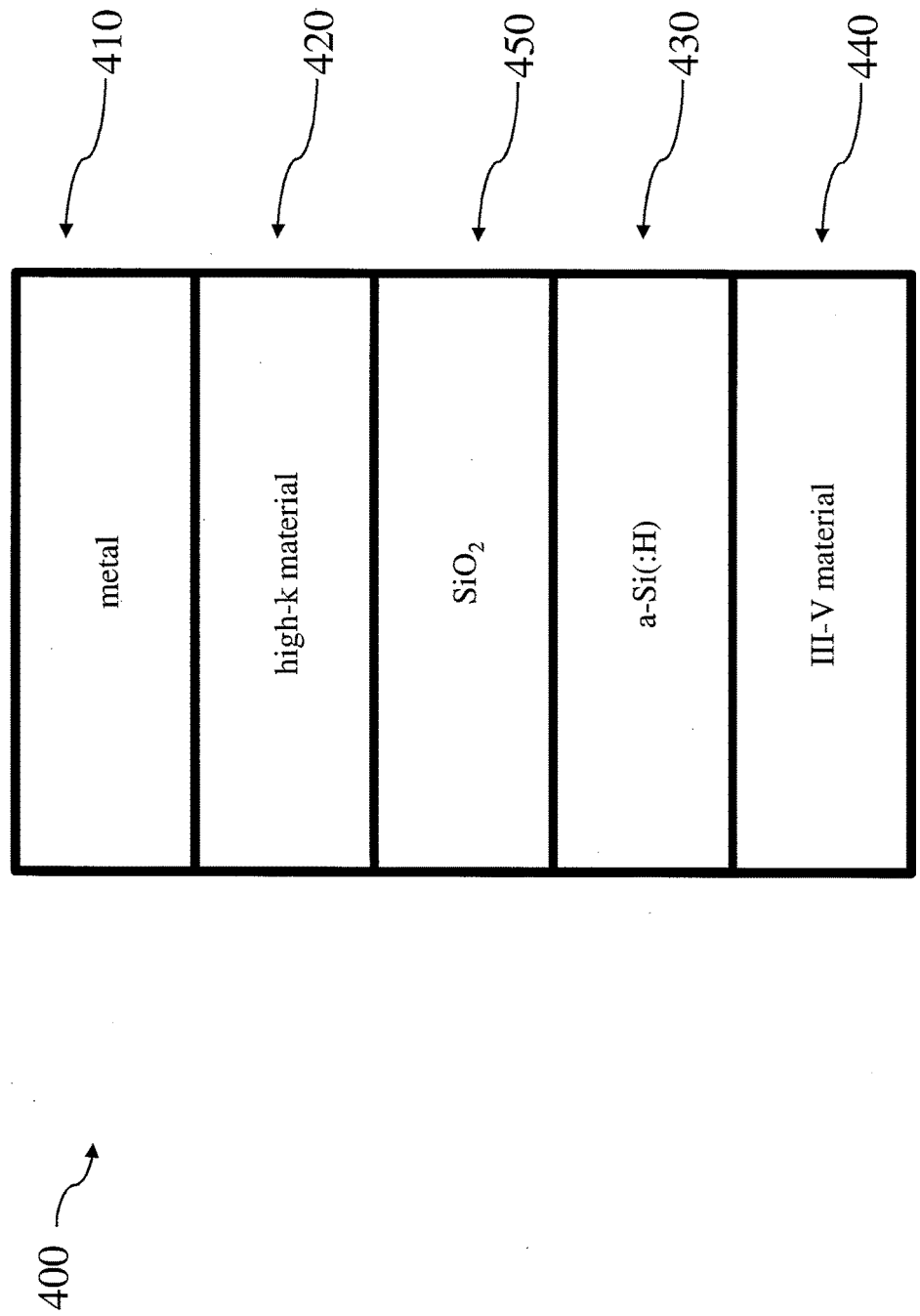
FIG. 4 illustrates a gate stack structure with a a-Si(:H) passivation layer between the III-V material and the high-k material.

FIG. 4 illustrates a gate stack structure 400 with a a-Si(:H) passivation layer 430 between the III-V material 440 and the high-k material 420. A metal layer 410 connects to the top of the gate stack where a signal can be applied to the gate. A passivation layer has been applied here. The a-Si protects the III-V material from oxidation. However, there are several drawbacks to this approach. Intermixing can occur at the interface, including Indium diffusion from InGaAs through the a-Si(:H) passivation layer 430 towards the high-k material 420 that is composed of $HfO_2$. Also, an $SiO_2$ region 450 can form between the a-Si(:H) passivation layer 430 and the high-k material 420. The $SiO_2$ has low k, which reduces scalability.

Figure 5:
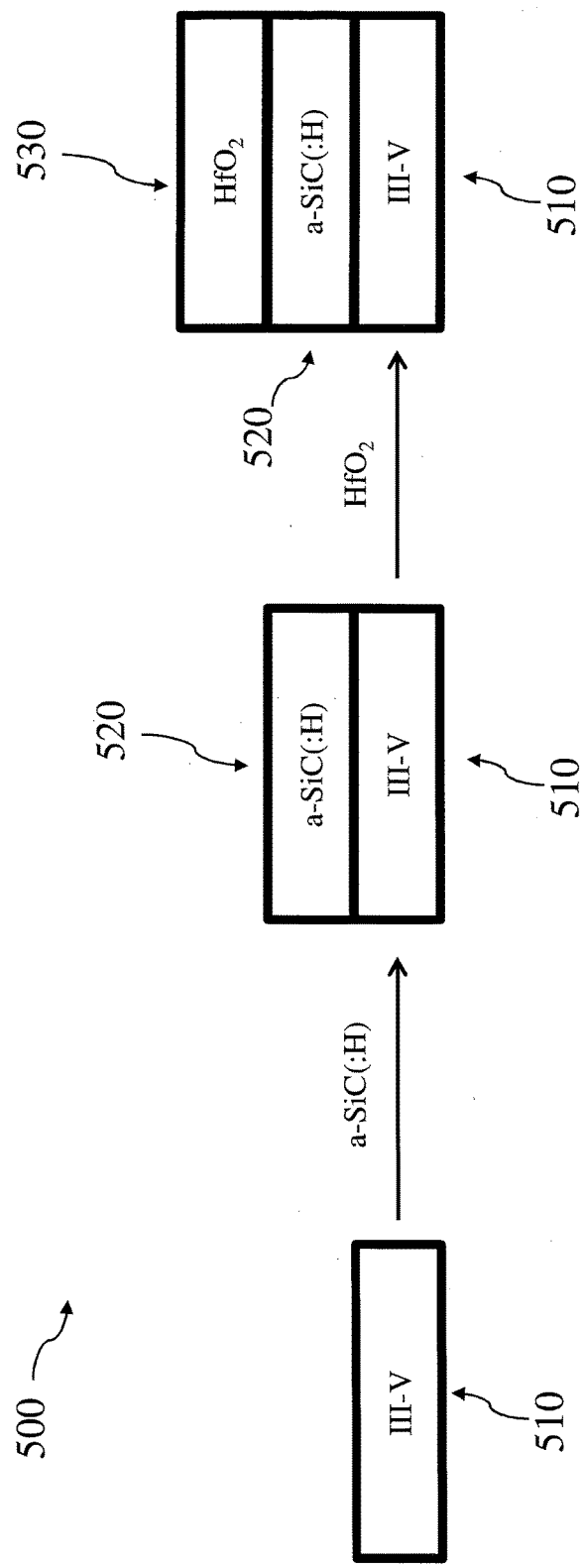
FIG. 5 illustrates a gate stack construction process, according to an embodiment of the present invention.

FIG. 5 shows the gate stack construction process, according to an embodiment of the present invention. A layer of amorphous silicon carbide (SiC) 520 is applied to the III-V layer 510. The III-V layer 510, in an embodiment, can comprise InGaAs. Finally, the high-k material 530 is applied to the gate stack 500. The high-k material, in an embodiment, can comprise $HfO_2$. The SiC protects the III-V layer 510 from oxidation. The SiC also minimizes intermixing, which results in better electric performance as the Si—C bond is 50% stronger than the Si—Si bond. This creates higher rigidity. Furthermore, SiC is high-k material with a k of 9 to 10, which improves scalability of the approach. The SiC region contributes the capacity of the system.

Figure 6:
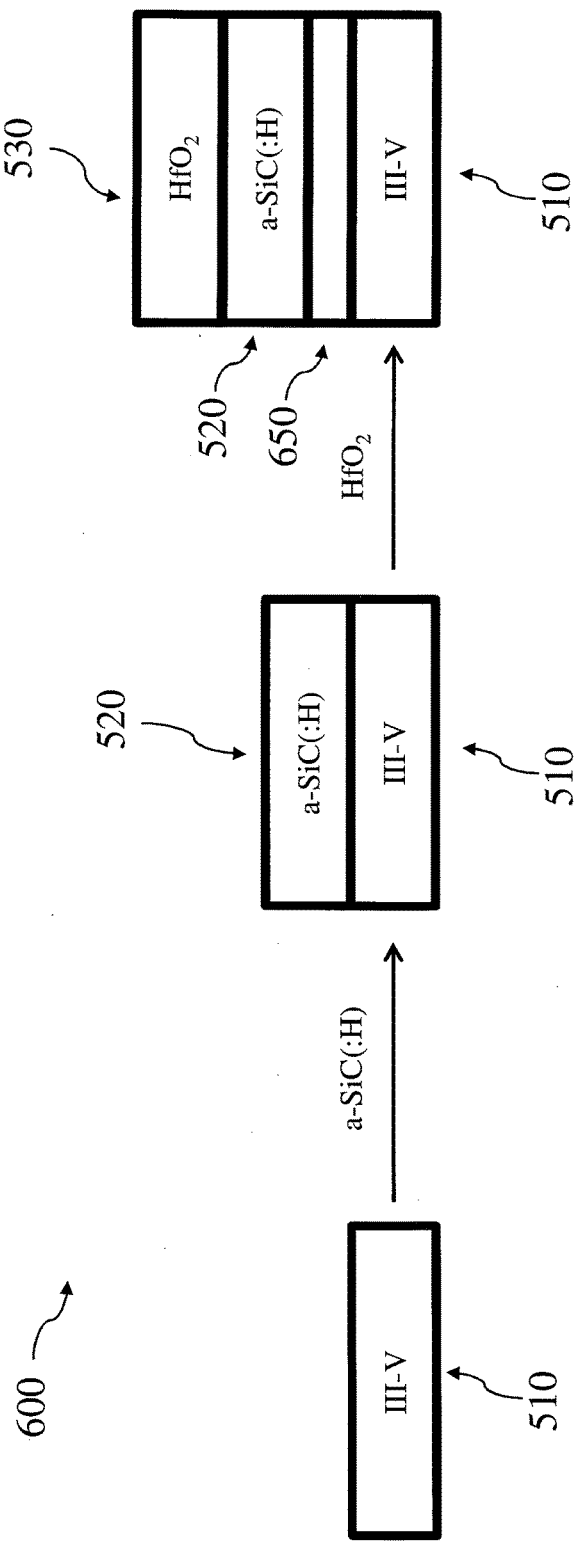
FIG. 6 illustrates a gate stack construction process, according to an embodiment of the present invention.

FIG. 6 illustrates a similar gate stack construction process, according to an embodiment of the present invention. Here, an optional 1 a-Si monolayer 650 is placed at the interface between the III-V channel material 510 and the passivation layer 520.

The use of silicon carbide instead of silicon to create a passivation layer is advantageous, as the silicon carbide has no intermixing during deposition and after annealing steps which are part of fabrication process. In addition, carbon diffusion in InGaAs is not favored. The rigidity of the structure increases the barrier for bond breaking. The relatively high k of the SiC leads to a high capacity in the stack, and the robustness of SiC to oxidation prevents the formation of low k layers.

Silicon carbide also provides a thermodynamically stable on III-V materials. This thermodynamic stability occurs during the $HfO_2$ deposition and during the post deposition annealing. The thermodynamic stability leads to a clean interface after the entire gate stack formation process has been completed.

Figure 7:
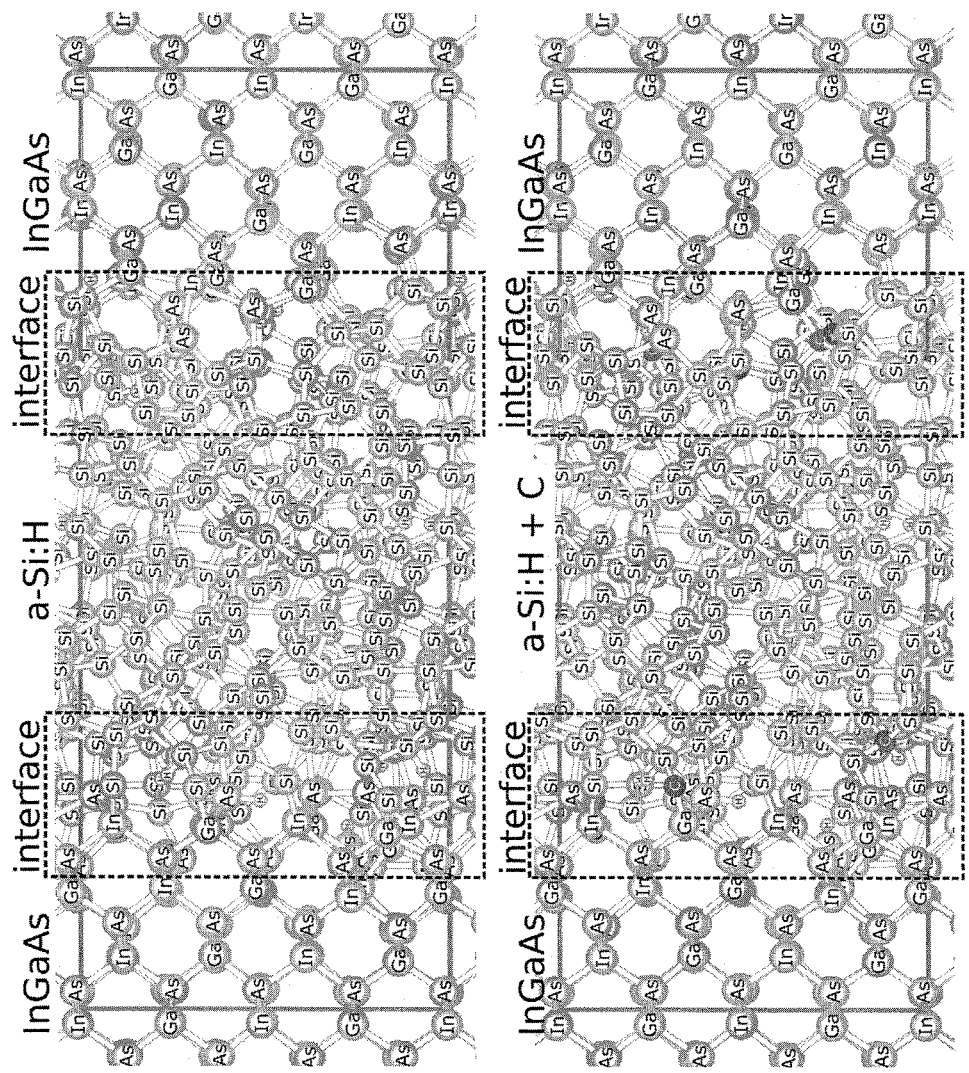
FIG. 7 shows the structures post-processed via DFT calculations, according to an embodiment of present invention.

FIG. 7 shows the structures post-processed via DFT calculations, according to an embodiment of present invention. The top panel of FIG. 7 illustrates an atomistic model of an interface indium gallium arsenide and hydrogenated amorphous silicon: InGaAs/a-Si:H. This configuration is the product the annealing obtained via replica-exchange molecular-dynamics simulations using a classical augmented-Tersoff potential, which was previously fit within our work to reproduce first-principles density functional theory (DFT) results. The structure, after classical annealing, was relaxed via DFT calculation. The bottom panel is the same structure above, but for 7 silicon atoms close to the interface that have been replaced with as many carbon atoms and then relaxed at DFT level.

Figure 8:
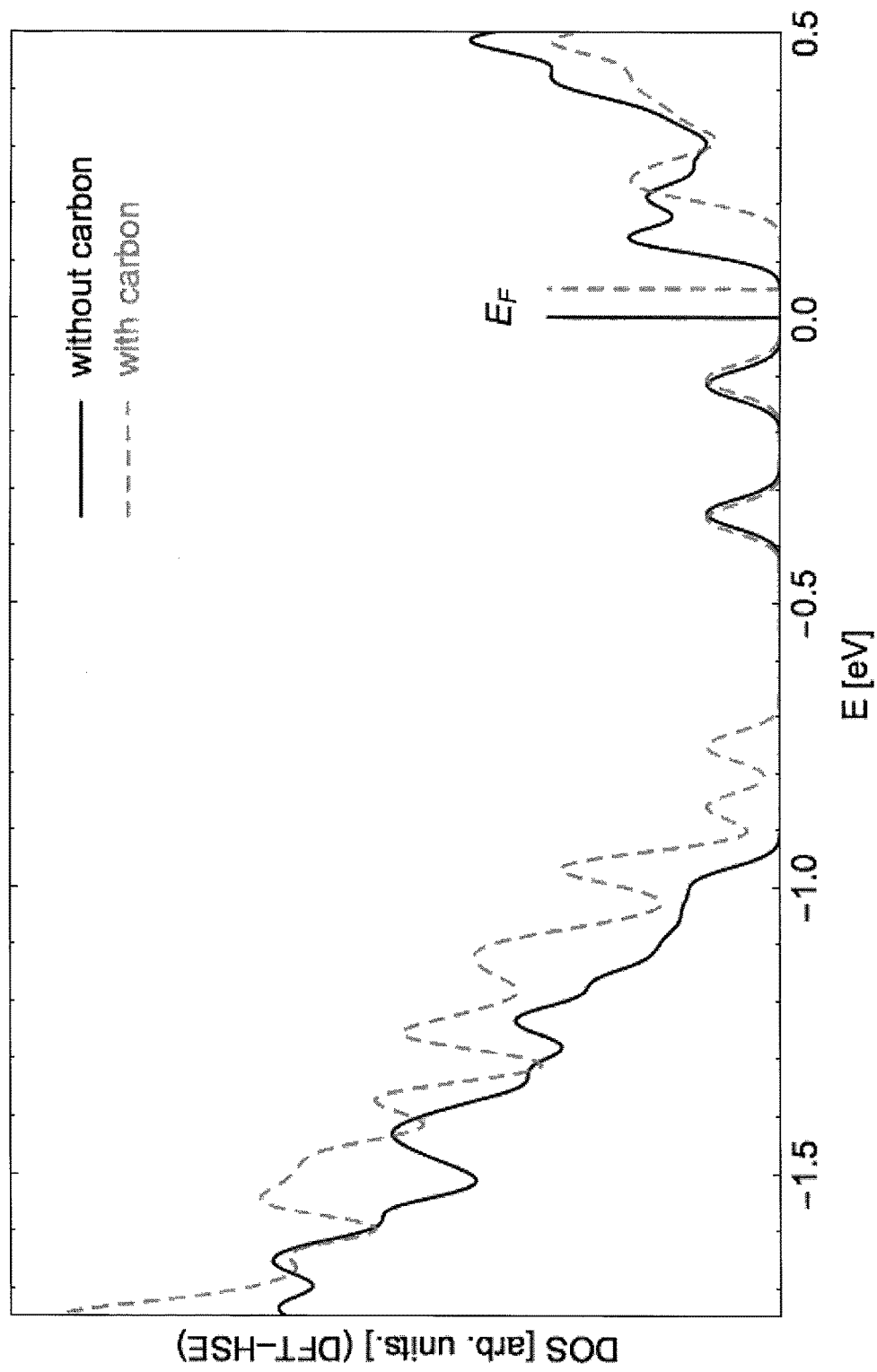
FIG. 8 shows DFT calculations, according to an embodiment of the present invention.

FIG. 8 shows DFT calculations, according to an embodiment of the present invention. FIG. 8 compares the electron density of states (DOSs) of the two structures of FIG. 7 computed at the DFT level using the hybrid functional HSE to correct the band gap. The two DOSs show the same defects in the band gap, which are not due to carbon doping. The occurrence of In—C, Ga—C, and As—C bonds does not affect the DOS. Doping with carbon does not have a negative impact on the electronic properties of the device. The marginal shrinking in the band gap is due to the stretched bonds induced by the replacement of silicon with the smaller carbon species. Further annealing the structure containing carbon can be done by adding in the classical model of the interactions between carbon and the other species, namely indium, gallium, arsenic, silicon, and hydrogen.

Figure 9:
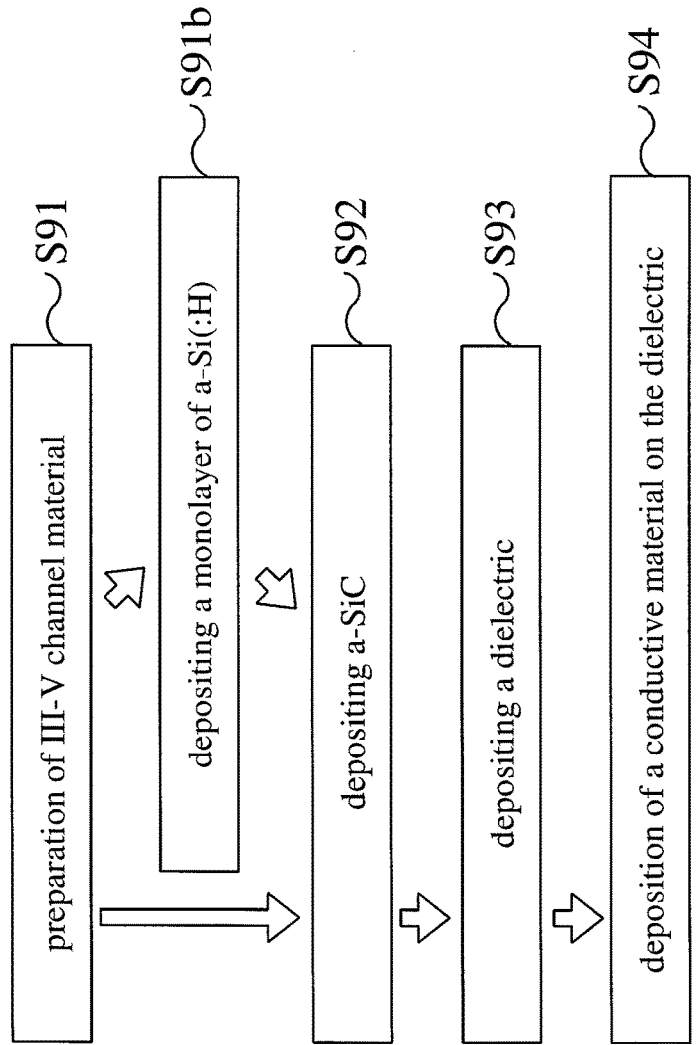
FIG. 9 shows a flow chart of method steps involved in a method for fabricating a semiconductor structure, according to an embodiment of the present invention.

FIG. 9 shows a flow chart of method steps involved in a method for fabricating a semiconductor structure. In step S91, the III-V channel material is prepared. In optional step S91b, a monolayer of a-Si(:H) is deposited. In step S92, a-SiC is deposited. In Step S93, a dielectric, such as hafnium oxide, is deposited onto the a-SiC. In step S94, a conductive material, such as aluminum, copper, or titanium nitride (TiN), is deposited onto the dielectric.

Figure 10:
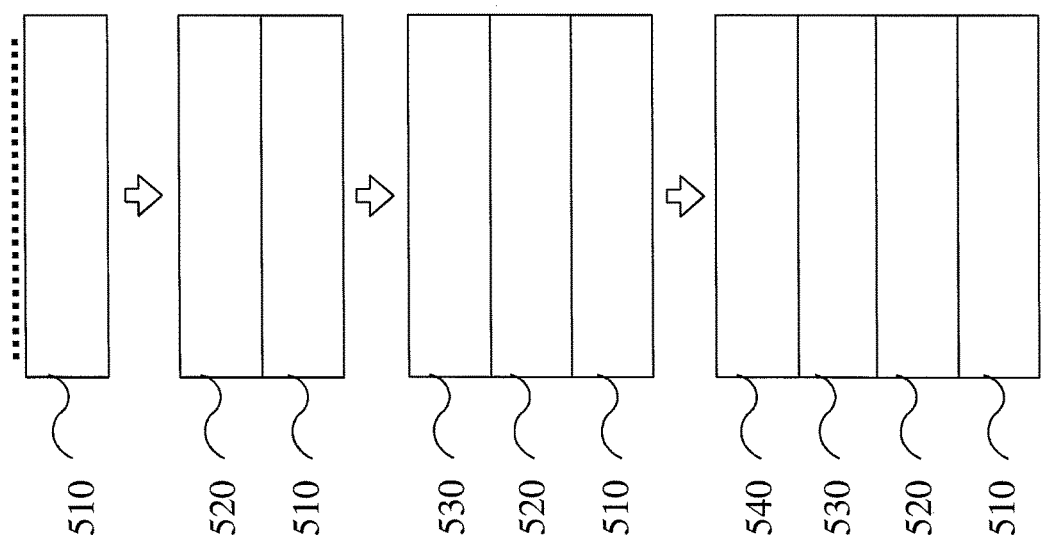
FIG. 10 shows schematic diagrams of an embodiment of a semiconductor structure and illustrates method steps involved in the fabrication of a semiconductor structure.

FIG. 10 shows schematic diagrams of an embodiment of a semiconductor structure and illustrates method steps involved in the fabrication of a semiconductor structure. First, a substrate 510 is prepared. Then, a-SiC(:H) 520 is deposited. A dielectric layer 530, such as hafnium oxide, is formed onto the structure. Finally, a metal layer 540 is formed on top of the dielectric layer.

Figure 11:
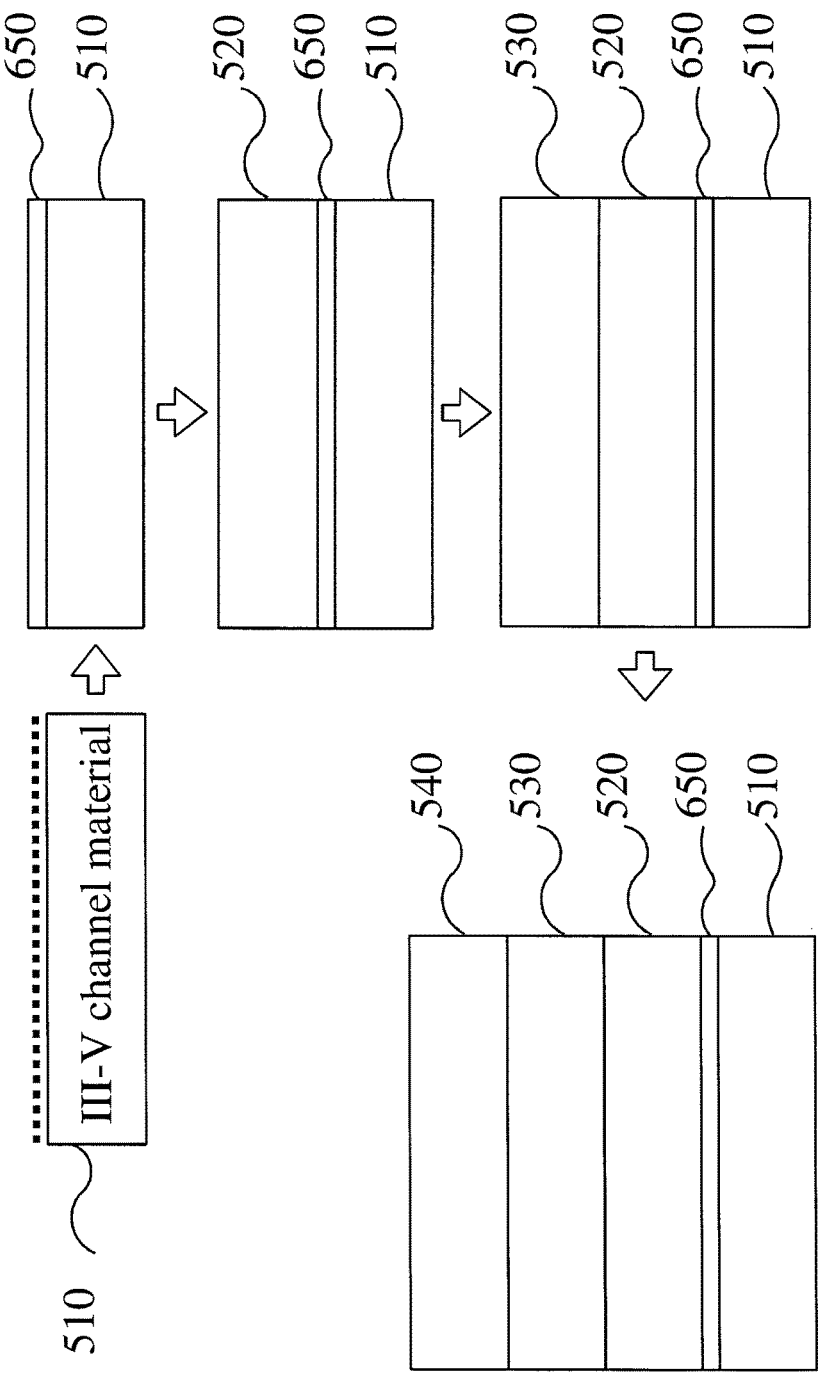
FIG. 11 shows an alternate schematic diagram of an embodiment of a semiconductor structure and illustrates method steps involved in the fabrication of a semiconductor structure.

FIG. 11 shows an alternate schematic diagram of an embodiment of a semiconductor structure and illustrates method steps involved in the fabrication of a semiconductor structure. A substrate 510 is prepared. Then, a monolayer of a-Si(:H) is deposited 650. A SiC layer 520 is deposited next. A dielectric layer 530, such as hafnium oxide, is then formed onto the structure. Finally, a metal layer 540 is formed on top of the dielectric layer.

Figure 12:
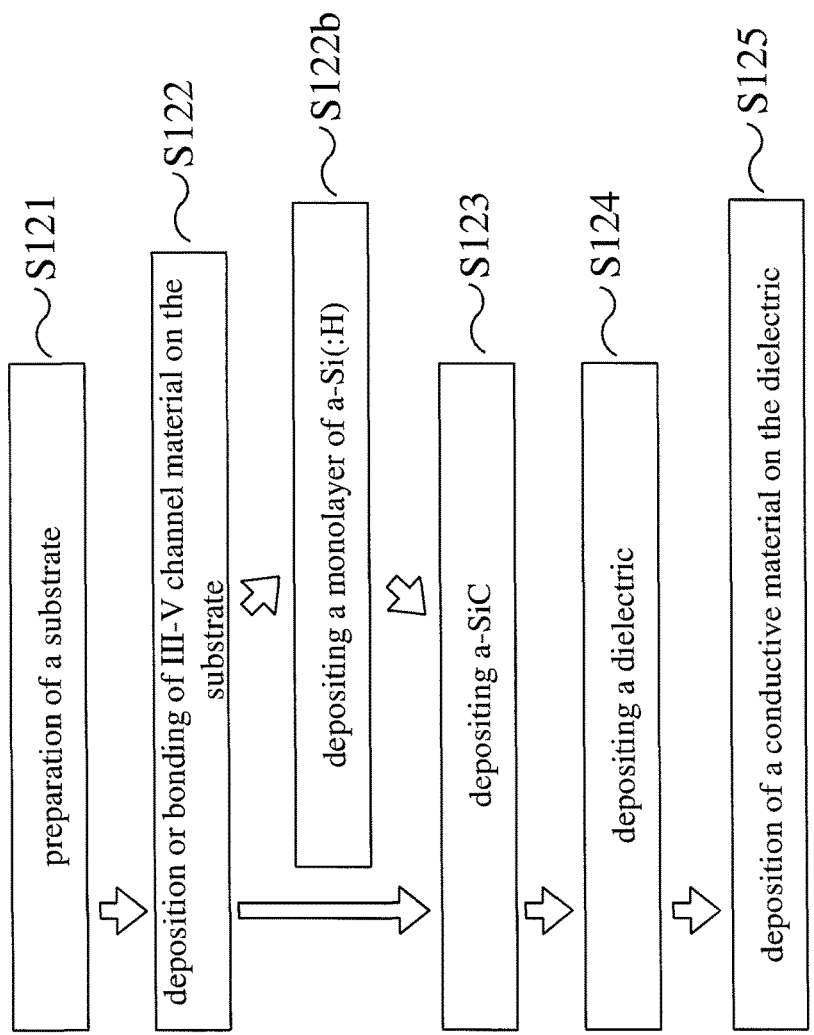
FIG. 12 shows a flow chart of method steps involved in a method for fabricating a semiconductor structure, according to an embodiment of the present invention.

FIG. 12 shows a flow chart of method steps involved in a method for fabricating a semiconductor structure, according to an embodiment of the present invention. In step S121, the substrate is prepared. In step 122, III-V channel material is deposited or bonded on the substrate. In optional step S122b, a monolayer of a-Si(:H) is deposited. In step S123, a-SiC is deposited. In Step S124, a dielectric, such as hafnium oxide, is deposited onto the a-SiC. In step S125, a conductive material, such as aluminum, copper, or titanium nitride (TN), is, deposited onto the dielectric.

Figure 13:
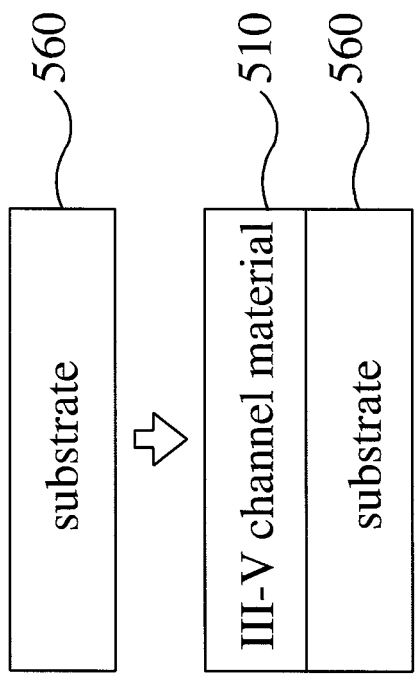
FIG. 13 shows different structures of the substrate element including only a III-V semiconductor compound (channel material), or a preferred embodiment consisting of a III-V compound on another semiconductor support, for example on silicon, or a III-V compound on a silicon on insulator material (SOI).

FIG. 13 shows different structures of the substrate element including only a III-V semiconductor compound (channel material), or a preferred embodiment consisting of a III-V compound on another semiconductor support, for example on silicon, or a III-V compound on a silicon on insulator material (SOI).

In an embodiment, a method of forming a high-k gate stack is provided. The method comprises forming a high-k dielectric layer on a substrate. The substrate is exposed to silicon carbide deposition to passivate bonding defects in the high-k gate stack. A gate electrode is then formed on the substrate. In certain embodiments, the high-k dielectric layer is a metal oxide containing layer. In certain embodiments, the high-k dielectric layer is annealed.

In an embodiment, an apparatus for a gate stack structure comprises a layer of III-V material, a passivation layer comprising a layer of amorphous silicon carbide deposited on the layer of III-V material, and a layer of a high-k material deposited on the passivation layer.

According to an embodiment, an apparatus for a gate stack structure comprises a layer of III-V material, a passivation layer deposited on the layer of III-V material, wherein the passivation layer comprises a layer of amorphous silicon carbide, and a layer of a high-k material deposited on the passivation layer. This apparatus aids in the prevention of defect and oxide formation. Other optional embodiments are possible, such as those based on the following additional limitations. The high-k material may comprise hafnium oxide. The layer of amorphous silicon carbide may be hydrogenated. The passivation layer may comprise an amorphous silicon monolayer at the interface with the layer of III-V material. The layer of III-V material may comprise a compound semiconductor with one or more species are taken from group IIIA and one or more species taken from group VA. The layer of III-V material may be selected from the group consisting of boron nitride, boron arsenide, aluminum nitride, aluminum phosphide, aluminum arsenide, gallium nitride, gallium phosphide, gallium arsenide, indium nitride, indium phosphide, indium arsenide, and indium antimonide. The layer of III-V material may comprise indium gallium arsenide. The passivation layer may comprise a first sublayer and a second sublayer. The first sublayer may comprises hafnium oxide and the second sublayer comprises aluminum oxide.

In another embodiment, a passivating layer for a III-V semiconductor material comprises an at least one monolayer thick silicon carbide layer which bonds with the atomic constituents of the semiconductor material to prevent the formation of an oxide at the interface between the passivating layer and the semiconductor material.

In one embodiment, a method for constructing a gate stack comprises providing a semiconductor layer, wherein the semiconductor layer comprises a III-V material layer, depositing III-V material onto the semiconductor layer to create a III-V channel layer, depositing silicon carbide onto the semiconductor layer to create an amorphous silicon carbide layer on the semiconductor layer, and depositing a dielectric material having dielectric constant greater than silicon oxide onto the amorphous silicon carbide layer to create a high-k material layer on the amorphous silicon carbide layer. Other permissive embodiments are possible, such as those based on the following modifications to the method. The semiconductor layer may further comprise a substrate sublayer bellow the III-V material layer. The substrate sublayer may comprise silicon. The substrate sublayer may also comprise silicon on insulator. The high-k material layer may comprise hafnium oxide. The amorphous silicon carbide layer may be hydrogenated. The III-V material layer may comprise a compound semiconductor with one or more species are taken from group IIIA and one or more species taken from group VA. The III-V material layer may be selected from the group consisting of boron nitride, boron arsenide, aluminum nitride, aluminum phosphide, aluminum arsenide, gallium nitride, gallium phosphide, gallium arsenide, indium nitride, indium phosphide, indium arsenide, and indium antimonide. The III-V material layer may comprise indium gallium arsenide. In embodiments, the method further comprises depositing a conducting material on the dielectric layer.

While the foregoing written description of the invention enables one of ordinary skill to make and use what is considered presently to be the best mode thereof, those of ordinary skill will understand and appreciate the existence of alternatives, adaptations, variations, combinations, and equivalents of the specific embodiment, method, and examples herein. Those skilled in the art will appreciate that the within disclosures are exemplary only and that various modifications may be made within the scope of the present invention. In addition, while a particular feature of the teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the teachings will be apparent to those skilled in the art from consideration of the specification and practice of the teachings disclosed herein. The invention should therefore not be limited by the described embodiment, method, and examples, but by all embodiments and methods within the scope and spirit of the invention. Accordingly, the present invention is not limited to the specific embodiments as illustrated herein, but is only limited by the following claims.

What is claimed is:
1. An apparatus for a gate stack structure comprising:
a layer of III-V material;
a passivation layer deposited on the layer of III-V material; and
a layer of a high-k material deposited on the passivation layer;

wherein the passivation layer comprises a layer of amorphous silicon carbide; and wherein carbon of the amorphous silicon carbide prevents the formation of a low-k layer at an interface between the passivation layer and the layer of III-V material to prevent oxidation at the interface between the passivation layer and the layer of III-V material; and wherein the layer of III-V material, the passivation layer, and the layer of high-k material are annealed such that carbon of the amorphous silicon carbide is bonded with atoms of III-V material at an interface between the passivation layer and the layer of III-V material, bonds between the amorphous silicon carbide and the atoms of the III-V material being stretched and relaxed.

2. The apparatus of claim 1, wherein the high-k material comprises hafnium oxide.

3. The apparatus of claim 1, wherein the layer of amorphous silicon carbide is hydrogenated.

4. The apparatus of claim 1, wherein the passivation layer comprises an amorphous silicon monolayer at the interface with the layer of III-V material.

5. The apparatus of claim 1, wherein said layer of III-V material comprises a compound semiconductor with one or more species taken from group IIIA and one or more species taken from group VA.

6. The apparatus of claim 1, wherein said layer of III-V material is selected from the group consisting of boron nitride, boron arsenide, aluminum nitride, aluminum phosphide, aluminum arsenide, gallium nitride, gallium phosphide, gallium arsenide, indium nitride, indium phosphide, indium arsenide, and indium antimonide.

7. The apparatus of claim 1, wherein said layer of III-V material comprises indium gallium arsenide.

8. The apparatus of claim 1, wherein the passivation layer comprises a first sublayer and a second sublayer.

9. The apparatus of claim 8, wherein the first sublayer comprises hafnium oxide and the second sublayer comprises aluminum oxide.

10. A passivating layer for a III-V semiconductor material comprising:

an at least one monolayer thick amorphous silicon carbide layer which bonds with atomic constituents of said semiconductor material, wherein carbon of the amorphous silicon carbide is used to prevent formation of an oxide at an interface between said passivating layer and said semiconductor material, wherein the passivating layer is annealed such that the carbon of the amorphous silicon carbide is bonded with atoms of the semiconductor material, bonds between the carbon of the amorphous silicon carbide and atoms of the semiconductor material layer being stretched and relaxed.

11. A method for constructing a gate stack, the method comprising:

providing a semiconductor layer, wherein the semiconductor layer comprises a III-V material layer;

depositing III-V material onto the semiconductor layer to create a III-V channel layer;

depositing silicon carbide onto the semiconductor layer to create an amorphous silicon carbide layer on the semiconductor layer;

depositing a dielectric material having dielectric constant greater than silicon oxide onto the amorphous silicon carbide layer to create a high-k material layer on the amorphous silicon carbide layer; and annealing the semiconductor layer, the III-V channel layer, the amorphous silicon carbide layer, and the high-k material layer;

wherein carbon of the amorphous silicon carbide prevents the formation of a low-k layer at an interface between the amorphous silicon carbide layer and the III-V material layer to prevent oxidation at the interface between the amorphous silicon carbide layer and the III-V material layer; and wherein carbon of the amorphous silicon carbide is bonded with atoms of the III-V material layer at the interface between the amorphous silicon carbide layer and the III-V material layer, bonds between the amorphous silicon carbide and atoms of the III-V material layer being stretched and relaxed.

12. The method of claim 11, wherein the semiconductor layer further comprises a substrate sublayer below the III-V material layer.

13. The method of claim 12, wherein the substrate sublayer comprises silicon.

14. The method of claim 12, wherein the substrate sublayer comprises silicon on insulator.

15. The method of claim 11, wherein the high-k material layer comprises hafnium oxide.

16. The method of claim 11, wherein the amorphous silicon carbide layer is hydrogenated.

17. The method of claim 11, wherein the III-V material layer comprises a compound semiconductor with one or more species taken from group IIIA and one or more species taken from group VA.

18. The method of claim 11, wherein the III-V material layer is selected from the group consisting of boron nitride, boron arsenide, aluminum nitride, aluminum phosphide, aluminum arsenide, gallium nitride, gallium phosphide, gallium arsenide, indium nitride, indium phosphide, indium arsenide, and indium antimonide.

19. The method of claim 11, wherein the III-V material layer comprises indium gallium arsenide.

20. The method of claim 11, further comprising depositing a conducting material on the dielectric layer.

* * * * *